(12) United States Patent
Hayashi

(10) Patent No.: US 8,975,537 B2
(45) Date of Patent: Mar. 10, 2015

(54) CIRCUIT SUBSTRATE, LAMINATED BOARD AND LAMINATED SHEET

(71) Applicant: Kyocera Corporation, Kyoto-shi, Kyoto (JP)

(72) Inventor: Katsura Hayashi, Shiga (JP)

(73) Assignee: Kyocera Corporation, Kyoto (JP)

( * ) Notice: Subject to any disclaimer, the term of this patent is extended or adjusted under 35 U.S.C. 154(b) by 47 days.

(21) Appl. No.: 13/900,092

(22) Filed: May 22, 2013

(65) Prior Publication Data

US 2013/0256018 A1 Oct. 3, 2013

Related U.S. Application Data

(63) Continuation of application No. 12/892,197, filed on Sep. 28, 2010, now Pat. No. 8,461,462.

(30) Foreign Application Priority Data

Sep. 28, 2009 (JP) .................. 2009-222549
Dec. 26, 2009 (JP) .................. 2009-296518
Sep. 28, 2010 (JP) .................. 2010-216683

(51) Int. Cl.
*H05K 1/11* (2006.01)
*H05K 1/03* (2006.01)
(Continued)

(52) U.S. Cl.
CPC ............ *H05K 1/0306* (2013.01); *H05K 3/4602* (2013.01); *H05K 3/4655* (2013.01); *H05K 3/4673* (2013.01); *H05K 1/0271* (2013.01); *H05K 1/03* (2013.01); *H05K 2201/0116* (2013.01); *H05K 2201/0175* (2013.01); *H05K 2201/0195* (2013.01); *H05K 2201/0209* (2013.01); *H05K 2201/0355* (2013.01); *H05K 2203/1152* (2013.01); *H01L 2224/16225* (2013.01)
USPC ........... 174/262; 174/255; 174/258; 174/264; 361/311; 361/321.2; 361/728; 257/177; 257/712; 257/778; 428/157; 438/108

(58) Field of Classification Search
USPC .................. 174/262, 258, 255, 264; 361/311, 361/321.2, 728; 257/177, 712, 778; 428/157; 438/108
See application file for complete search history.

(56) References Cited

U.S. PATENT DOCUMENTS

| | | | |
|---|---|---|---|
| 5,628,848 A | 5/1997 | Friese et al. | |
| 5,686,172 A | 11/1997 | Ohya et al. | |
| 5,770,275 A | 6/1998 | Raman et al. | |

(Continued)

FOREIGN PATENT DOCUMENTS

| | | |
|---|---|---|
| JP | 02253941 | 10/1990 |
| JP | 3-114284 A | 5/1991 |

(Continued)

OTHER PUBLICATIONS

Japanese Office Action, Japanese Patent Application No. 2013-105611, Feb. 12, 2014, 2 pp.

(Continued)

*Primary Examiner* — Xiaoliang Chen
(74) *Attorney, Agent, or Firm* — Volpe and Koenig, P.C.

(57) ABSTRACT

A circuit substrate includes a resin layer; and an inorganic insulating layer including a groove portion penetrating the inorganic insulating layer in a thickness direction thereof. A part of the resin layer is in the groove portion.

13 Claims, 11 Drawing Sheets

(51) Int. Cl.
*H05K 3/46* (2006.01)
*H05K 1/02* (2006.01)

(56) References Cited

U.S. PATENT DOCUMENTS

| | | | |
|---|---|---|---|
| 6,113,730 | A | 9/2000 | Ohya et al. |
| 6,270,906 | B1 | 8/2001 | Nakamura et al. |
| 6,295,196 | B1 | 9/2001 | Hamaji et al. |
| 6,409,725 | B1 | 6/2002 | Khandkar et al. |
| 6,509,060 | B1 | 1/2003 | Komoda et al. |
| 6,660,115 | B2 | 12/2003 | Butler et al. |
| 6,765,638 | B1 | 7/2004 | Masuzawa |
| 6,841,740 | B2 | 1/2005 | Ogawa et al. |
| 7,484,897 | B2 | 2/2009 | Ono et al. |
| 2002/0023419 | A1 | 2/2002 | Penth et al. |
| 2002/0039964 | A1 | 4/2002 | Tanaka et al. |
| 2002/0041952 | A1 | 4/2002 | Murota et al. |
| 2002/0055571 | A1 | 5/2002 | Hirano et al. |
| 2002/0094604 | A1* | 7/2002 | Hayama et al. .......... 438/108 |
| 2002/0141920 | A1 | 10/2002 | Alvin et al. |
| 2003/0003237 | A1 | 1/2003 | Seabaugh et al. |
| 2003/0063889 | A1 | 4/2003 | Lavallee et al. |
| 2003/0080476 | A1 | 5/2003 | Barton et al. |
| 2003/0109375 | A1 | 6/2003 | Gohlke et al. |
| 2003/0127747 | A1* | 7/2003 | Kajiwara et al. ......... 257/778 |
| 2003/0228457 | A1 | 12/2003 | Hasegawa et al. |
| 2004/0023011 | A1 | 2/2004 | Sumi et al. |
| 2004/0075197 | A1 | 4/2004 | Tang |
| 2004/0104495 | A1 | 6/2004 | Laubersheimer |
| 2004/0115416 | A1 | 6/2004 | Nonninger et al. |
| 2005/0084219 | A1 | 4/2005 | Catchmark et al. |
| 2005/0105860 | A1 | 5/2005 | Ono et al. |
| 2005/0202241 | A1 | 9/2005 | Shang et al. |
| 2005/0207091 | A1 | 9/2005 | Kambe et al. |
| 2005/0214466 | A1 | 9/2005 | Prochazka et al. |
| 2005/0263867 | A1 | 12/2005 | Kambe et al. |
| 2005/0287377 | A1 | 12/2005 | Wada |
| 2006/0084277 | A1 | 4/2006 | Nakashima et al. |
| 2006/0099328 | A1 | 5/2006 | Waite et al. |
| 2006/0099397 | A1 | 5/2006 | Thierauf et al. |
| 2006/0108601 | A1 | 5/2006 | Okamoto |
| 2006/0131784 | A1 | 6/2006 | Sugimoto |
| 2006/0148633 | A1 | 7/2006 | Kuhn et al. |
| 2006/0154057 | A1 | 7/2006 | Nonninger |
| 2006/0154233 | A1 | 7/2006 | Deutsch |
| 2006/0231988 | A1 | 10/2006 | Ehlen et al. |
| 2006/0266475 | A1 | 11/2006 | Kumar et al. |
| 2006/0272853 | A1 | 12/2006 | Muramatsu et al. |
| 2007/0026196 | A1* | 2/2007 | Ogawa et al. ............ 428/157 |
| 2007/0087117 | A1 | 4/2007 | Jabado et al. |
| 2007/0102647 | A1 | 5/2007 | Johnson et al. |
| 2007/0116869 | A1 | 5/2007 | Wei et al. |
| 2007/0129233 | A1 | 6/2007 | Ueno et al. |
| 2007/0178279 | A1 | 8/2007 | Ogawa et al. |
| 2007/0241450 | A1 | 10/2007 | Hiramatsu et al. |
| 2007/0242414 | A1 | 10/2007 | Seh et al. |
| 2007/0259181 | A1 | 11/2007 | Furuzono et al. |
| 2007/0263364 | A1 | 11/2007 | Kawabe et al. |
| 2007/0267739 | A1 | 11/2007 | Kajiwara et al. |
| 2008/0011987 | A1 | 1/2008 | Arao et al. |
| 2008/0033298 | A1 | 2/2008 | Habu et al. |
| 2008/0063342 | A1 | 3/2008 | Ono et al. |
| 2008/0099911 | A1 | 5/2008 | Machida |
| 2008/0132409 | A1 | 6/2008 | Ito et al. |
| 2008/0182128 | A1 | 7/2008 | Boy et al. |
| 2008/0190841 | A1 | 8/2008 | Pascaly et al. |
| 2008/0241723 | A1 | 10/2008 | Kmiecik-Lawrynowicz et al. |
| 2008/0245735 | A1 | 10/2008 | Hennige et al. |
| 2008/0274613 | A1 | 11/2008 | Dernovsek et al. |
| 2009/0020916 | A1 | 1/2009 | Kalman et al. |
| 2009/0056987 | A1 | 3/2009 | Nomiya et al. |
| 2009/0084673 | A1 | 4/2009 | Ogata et al. |
| 2009/0135546 | A1 | 5/2009 | Wang et al. |
| 2009/0148978 | A1 | 6/2009 | Hampden-Smith et al. |
| 2009/0220561 | A1 | 9/2009 | Jin et al. |
| 2009/0269664 | A1 | 10/2009 | Kim |
| 2010/0081561 | A1 | 4/2010 | Nakata et al. |
| 2011/0073358 | A1 | 3/2011 | Hayashi |
| 2011/0232953 | A1 | 9/2011 | Oga et al. |

FOREIGN PATENT DOCUMENTS

| | | |
|---|---|---|
| JP | 04122087 | 4/1992 |
| JP | 5147152 A | 6/1993 |
| JP | 5254052 A | 10/1993 |
| JP | 6-40783 A | 2/1994 |
| JP | 725607 A | 1/1995 |
| JP | 8-172251 A | 7/1996 |
| JP | 1070364 A | 3/1998 |
| JP | 1192627 A | 4/1999 |
| JP | 2003124635 A | 4/2003 |
| JP | 2003258436 A | 9/2003 |
| JP | 2003283141 A | 10/2003 |
| JP | 2004153147 A | 5/2004 |
| JP | 2004281999 A | 10/2004 |
| JP | 2005327757 A | 11/2005 |
| JP | 2006117763 A | 5/2006 |
| JP | 2006272713 A | 10/2006 |
| JP | 2006285226 A | 10/2006 |
| JP | 2007-281115 A | 10/2007 |
| JP | 2007266416 A | 10/2007 |
| JP | 2007311770 A | 11/2007 |
| JP | 2009004709 A | 1/2009 |
| JP | 2009137808 A | 6/2009 |
| WO | 2006043474 A1 | 4/2006 |

OTHER PUBLICATIONS

Chinese Office Action, Chinese Patent Application No. 201080043565.8, Apr. 2, 2014, 9 pp.

Japanese Office Action with English concise explanation, Japanese Patent Application No. 2010-216683, Mar. 13, 2014, 4 pp.

Japanese Office Action, Japanese Patent Application No. 2011-533084, Jun. 3, 2014, 2 pp.

Japanese Office Action, Japanese Patent Application No. 2011-533080, Jun. 3, 2014, 2 pp.

* cited by examiner

CIRCUIT SUBSTRATE, LAMINATED BOARD AND LAMINATED SHEET

CROSS REFERENCE TO RELATED APPLICATION

This application is a continuation of U.S. patent application Ser. No. 12/892,197, filed Sep. 28, 2010 which is incorporated by reference as if fully set forth.

BACKGROUND OF THE INVENTION

1. Technical Field

The present invention relates to a circuit substrate, laminated board, and laminated sheet used for electronic apparatuses (e.g., audiovisual apparatuses, electrical appliances, communication apparatuses, computer apparatuses, and the peripheral devices thereof.

2. Description of the Related Art

Hitherto, a mounting structure in which mounting electronic components are mounted on a circuit substrate has been used.

Japanese Unexamined Patent Application Publication No. 4-122087 discloses a circuit substrate having a resin layer, an inorganic insulating layer provided on the upper surface of the resin layer, and a conductive layer provided on the inorganic insulating layer.

Generally, the inorganic insulating layer is easier to get a crack than the resin layer. Thus, when stress is applied to the circuit substrate, a crack is relatively easily generated in the inorganic insulating layer, and a crack generated might grow in the thickness direction of the inorganic insulating layer, resulting in the decreased electric reliability of the circuit substrate.

SUMMARY

It is an object of the present invention to provide a circuit substrate, a laminated board, and a laminated sheet that satisfy a demand for increasing the electric reliability.

According to one embodiment of the invention, a circuit substrate comprises a resin layer; and an inorganic insulating layer including a groove portion penetrating the inorganic insulating layer in a thickness direction thereof. A part of the resin layer is in the groove portion.

Figure 1A:
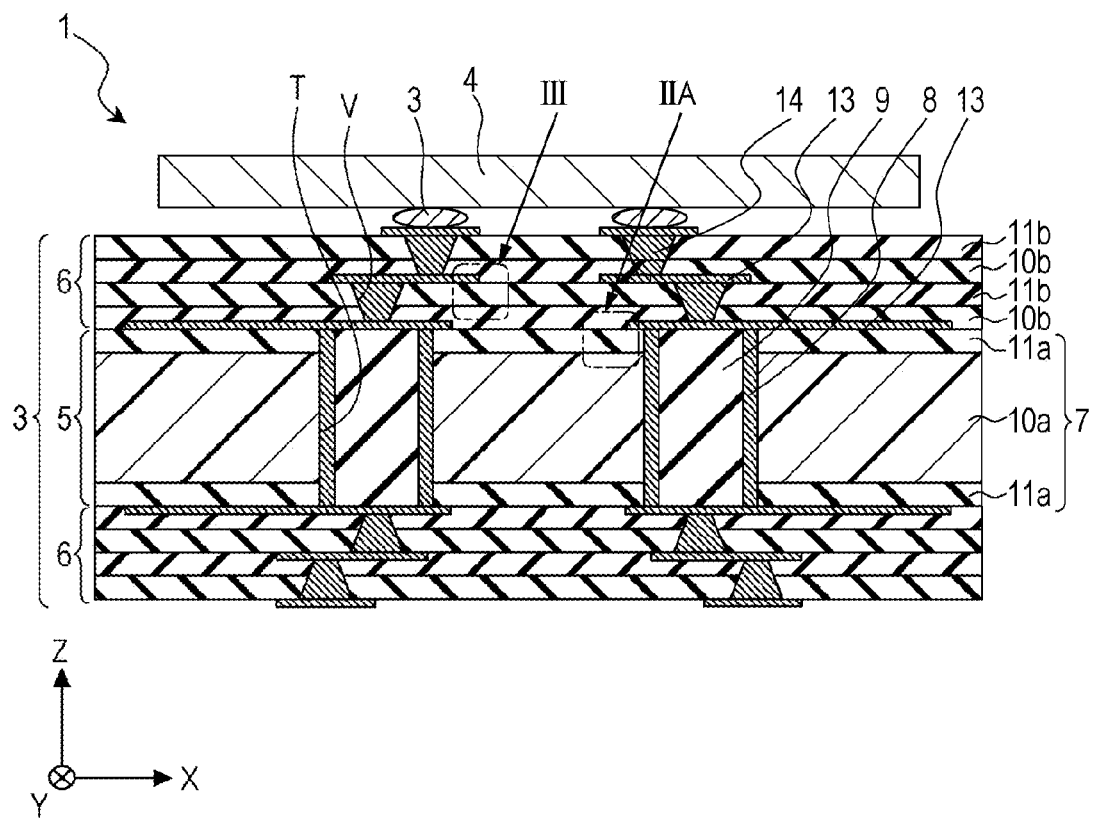
FIG. 1A is a cross sectional view illustrating a mounting structure according to one embodiment of the present invention along the vertical direction and FIG. 1B schematically illustrates a state that two inorganic insulating particles are connected to each other.

REFERENCE NUMERALS 1 mounting structure
2 electronic component
3 circuit substrate
4 bump
5 core substrate
6 circuit layer
7 base
8 through-hole conductor
9 insulator
10a first resin layer
10b second resin layer
11a first inorganic insulating layer
11b second inorganic insulating layer
11p inorganic insulating particle
11p1 connected region
12a first inorganic insulating filler
12b second inorganic insulating filler
13 conductive layer
13x copper foil
14 via-conductor
15 laminated board
16a first laminated sheet
16b second laminated sheet
T through-hole
V via-hole
D groove portion
C intersection

DETAILED DESCRIPTION OF THE PREFERRED EMBODIMENTS

A circuit substrate and a mounting structure according to an embodiment of the present invention are described below in detail with reference to the attached drawings.

A mounting structure 1 illustrated in FIG. 1A is used for various electronic apparatuses such as audiovisual apparatuses, electrical appliances, communication apparatuses, computer apparatuses, and the peripheral devices thereof. The mounting structure 1 includes an electronic component 2 and a circuit substrate 3.

The electronic component 2 is a semiconductor device such as an IC or an LSI. The electronic component 2 may be mounted on the circuit substrate 3 through bumps 4 made of conductive material such as solder using a flip chip packaging technology.

The parent material of this electronic component 2 is composed of a semiconductor material, for example, silicon, germanium and gallium arsenide, gallium-arsenic-phosphorus, gallium nitride, silicon carbide, or the like. As the electronic component 2, a component having an average thickness of, for example, 0.1 mm or more and 1 mm or less can be used.

The circuit substrate 3 includes a core substrate 5, circuit layers 6 on an upper surface and a lower surface of the core substrate 5.

The core substrate 5 serves to increase the rigidity of the circuit substrate 3. This core substrate 5 includes a base 7, through-holes T penetrating the base 7 in a vertical direction, through-hole conductors 8 formed along the inner wall of the through-hole T and having a cylindrical shape, and insulators 9 filling a remaining space surrounded by the through-hole conductor 8.

The base 7 serves to increase the rigidity of the core substrate 5 and has a first resin layer 10a and first inorganic insulating layers 11a provided on the upper and lower surfaces of the first resin layer 10a.

The first resin layer 10a constitutes a principal part of the base 7 and contains a resin portion and a base material covered by the resin portion. In the first resin layer 10a, the thickness is set to 0.1 mm or more and 3.0 mm or lower, the Young's modulus is set to 0.2 GPa or more and 20 GPa or lower, the coefficient of thermal expansion in the plane direction is set to 3 ppm/° C. or more and 20 ppm/° C. or lower, the coefficient of thermal expansion in the thickness direction is set to 30 ppm/° C. or more and 50 ppm/° C. or lower, and the dielectric dissipation factor is set to 3 or more and 4 or lower. Here, the Young's modulus is specified according to JISC5600:2006, the coefficient of thermal expansion is specified according to ISO11359-2:1999, and the dielectric dissipation factor is specified according to JISK6911:1995.

The resin portion of the first resin layer 10a can be formed with thermosetting resin, such as epoxy resin, bismaleimide triazine resin, cyanate resin, polyphenylene ether resin, all aromatic polyamide resins or polyimide resins. In the resin portion, for example, the Young's modulus is set to 0.1 GPa or more and 5 GPa or lower and the coefficient of thermal expansions in the plane direction and the thickness direction are set to 20 ppm/° C. or more and 50 ppm/° C. or lower.

The base material contained in the first resin layer 10a serves to reduce the coefficient of thermal expansion of the first resin layer 10a and increase the rigidity of the first resin layer 10a. The base material can be formed with, for example, woven fabric or nonwoven fabric formed with two or more fibers or a fiber bundle in which fibers are arranged in one direction. As the fibers, a glass fiber, a resin fiber, a carbon fiber, a metal fiber, or the like can be used.

The first resin layer 10a preferably contains first inorganic insulating filler 12a including a plurality of filler particles. As a result, the coefficient of thermal expansion of the first resin layer 10a can be reduced and the rigidity of the first resin layer 10a can be increased. The first inorganic insulating filler 12a can be formed with, for example, inorganic insulating materials, such as silicon oxide, aluminum oxide, aluminum nitride, aluminum hydroxide, or calcium carbonate. In the first inorganic insulating filler 12a, the diameter of the filler particles is set to 0.2 μm or more and 3 μm or lower and the coefficient of thermal expansion is set to 0 ppm/° C. or more and 15 ppm/° C. or lower. In the first inorganic insulating filler 12a, the ratio of the volume of the first inorganic insulating filler 12a relative to the total volume of the resin portion and the first inorganic insulating filler 12a of the first resin layer 10a is set to, for example, 3% by volume or more and 60% by volume or lower.

Figure 1B:
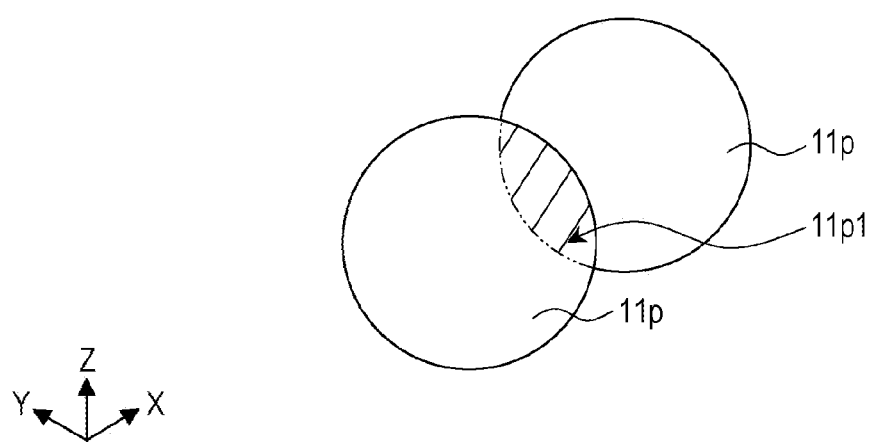

The first inorganic insulating layers 11a have two or more inorganic insulating particles 11p that are mutually connected to each other as illustrated in FIG. 1B, for example. The mutually-connected particles make the inside dense. A region where the inorganic insulating particles 11p are mutually connected to each other is referred to as a connected region 11p1.

The first inorganic insulating layers 11a are formed with inorganic insulating materials and have rigidity higher than that of resin materials. Thus, the rigidity of the base 7 can be increased. The coefficient of thermal expansion of the first inorganic insulating layers 11a is lower than the coefficient of thermal expansion of resin materials. Thus, the coefficient of thermal expansion in the plane direction of the circuit substrate 3 can be brought close to the coefficient of thermal expansion in the plane direction of the electronic components 2 and curvature of the circuit substrate 3 resulting from thermal stress can be reduced. The presence of the first inorganic insulating layers 11a can reduce the coefficient of thermal expansion in the thickness direction of the base 7, can reduce thermal stress resulting from differences in the coefficient of thermal expansion between the base 7 and the through-hole conductors 8, and can suppress disconnection of the through-hole conductors 8. The first inorganic insulating layers 11a are formed with inorganic insulating materials having a dielectric dissipation factor lower than that of resin materials, and thus are formed on the top layer and the bottom layer of the core substrate 5. Thus, the signal transmission characteristics of the circuit layers 6 disposed on the upper and lower surface of the core substrate 5 can be increased.

The thickness of the first inorganic insulating layers 11a described above is, for example 3 μm or more and 100 μm or lower and/or set to 3% or more and 10% or lower of the first resin layer 10a. The Young's modulus thereof is set to 10 GPa or more and 100 GPa or lower and/or 10 times or more and 100 times or lower than the Young's modulus of the resin portion of the first resin layer 10a. In the first inorganic insulating layers 11a, the coefficient of thermal expansion in the thickness direction and in the plane direction is set to, for example, 0 ppm/° C. or more and 10 ppm/° C. or lower and the dielectric dissipation factor is set to 0.0001 or more and 0.01 or lower.

Such first inorganic insulating layers 11a can be formed with inorganic insulating materials, such as silicon oxide, aluminum oxide, boron oxide, magnesium oxide, or calcium oxide. Among the above, silicon oxide is preferably used from the viewpoint of a low dielectric dissipation factor and a low coefficient of thermal expansion. By reducing the anisotropy of the coefficient of thermal expansion resulting from a crystal structure anisotropy in the first inorganic insulating layers by the use of an amorphous silicon oxide, the generation of a crack can be suppressed.

The inorganic insulating particles 11p constituting the first inorganic insulating layers 11a are preferably spherical. In this case, since the spaces between the inorganic insulating particles 11p are smaller, the internal structure of the first inorganic insulating layers 11a can be made dense. Thus, the rigidity of the first inorganic insulating layers 11a can be increased.

The diameter of the inorganic insulating particles 11p is preferably set to 3 nm or more and 110 nm or lower. As a result, the connection between the inorganic insulating particles 11p can be strengthened and the internal structure of the first inorganic insulating layers 11a can be made dense. The diameter of the inorganic insulating particles 11p is measured by observing the polished surface or the fracture surface of the first inorganic insulating layers 11a under a field emission type electron microscope, taking a photograph of a cross section that is enlarged so that the number of the particles contained therein is 20 or more and 50 or lower, and measuring the maximum diameter of each particle in the enlarged cross section.

The base 7 has through-holes T having a columnar shape that penetrate the base 7 in the thickness direction and have a diameter of, for example, 0.1 mm or more and 1 mm or lower. In the through-holes T, the through-hole conductors 8 that electrically connect the circuit layers 6 on the upper and lower surfaces of the core substrate 5 are formed in a cylindrical shape along the inner wall of the through-holes T. The through-hole conductors 8 can be formed with, for example, conductive materials, such as copper, silver, gold, aluminum, nickel, or chromium, and the coefficient of thermal expansion thereof is set to 14 ppm/° C. or more and 18 ppm/° C. or lower.

In the hollow portion of the cylindrical through-hole conductors 8, an insulator 9 is formed in a columnar shape and supports via-conductor 14 described later. The insulator 9 can be formed with, for example, resin materials, such as polyimide resin, acrylic resin, epoxy resin, cyanate resin, fluororesin, silicon resin, polyphenylene ether resin, or bismaleimide triazine resin.

In contrast, a pair of the circuit layers 6 is formed on the upper and lower surfaces of the core substrate 5 as described above. The circuit layers 6 includes second resin layers 10b, second inorganic insulating layers 11b, conductive layers 13, via-holes V, and the via-conductors 14. The conductive layers 13 and the via-conductors 14 are electrically connected to each other and constitute ground line, electric power supply line, and/or signal line.

The second resin layers 10b function as insulating members for suppressing a short circuit of the conductive layers 13. The second resin layers 10b can be formed with, for example, thermosetting resin, such as epoxy resin, bismaleimide triazine resin, cyanate resin, polyphenylene ether resin, all aromatic polyamide resins, or polyimide resins.

In the second resin layers 10b, the thickness is set to 3 μm or more and 30 μm or lower and the Young's modulus thereof is set to 0.2 GPa or more and 20 GPa or lower. In the second resin layers 10b, the dielectric dissipation factor is set to 3 or more and 4 or lower and the coefficients of thermal expansion in the plane direction and in the thickness direction are set to 20 ppm/° C. or more and 50 ppm/° C. or lower.

The second resin layers 10b preferably contain second inorganic insulating filler 12b including a plurality of filler particles. The second inorganic insulating filler 12b can be formed with the same material as that of the first inorganic insulating filler 12a and can reduce the coefficient of thermal expansion of the second resin layers 10b and can increase the rigidity of the second resin layers 10b.

The second inorganic insulating layers 11b are formed on the second resin layers 10b and are constituted by inorganic insulating materials having a higher rigidity, a lower coefficient of thermal expansion, and a lower dielectric dissipation factor than those of resin materials similarly as in the above-described first inorganic insulating layers 11a. Thus, the second inorganic insulating layers 11b can demonstrate the same effects as those of the first inorganic insulating layers 11a.

The thickness of the second inorganic insulating layers 11b is set to 3 μm or more and 30 μm or lower and/or 0.5 times or more and 10 times or lower than the thickness of the second resin layers 10b, for example. The other structure is the same as that of the first inorganic insulating layers 11a, for example.

The conductive layers 13 are formed on the second inorganic insulating layers 11b and are mutually separated in the thickness direction through the second resin layers 10b and the second inorganic insulating layers 11b. The conductive layers 13 can be formed with, for example, metal materials, such as copper, silver, gold, aluminum, nickel, or chromium. In the conductive layers 13, the thickness is set to 3 μm or more and 20 μm or lower and the coefficient of thermal expansion is set to 14 ppm/° C. or more and 18 ppm/° C. or lower.

The via-conductors 14 mutually connect the conductive layers 13 that are mutually separated in the thickness direction and are formed in a columnar shape in which the width is narrower toward the core substrate 5. As the via-conductors 14, via-conductors formed with conductive materials, such as copper, silver, gold, aluminum, nickel, or chromium can be used and the coefficient of thermal expansion is set to 14 ppm/° C. or more and 18 ppm/° C. or lower.

Figure 2A:
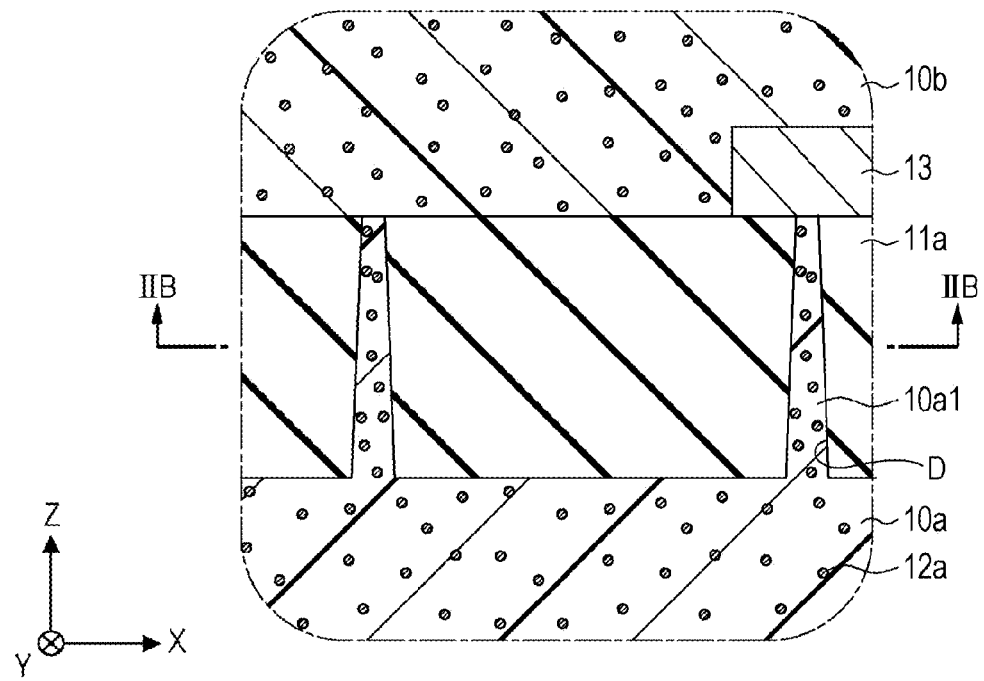
FIG. 2A is an enlarged cross sectional view illustrating an IIA portion of the mounting structure illustrated in FIG. 1A

In the circuit substrate 3 of this embodiment, the first inorganic insulating layer 11a has groove portions D penetrating in the thickness direction and a part of the first resin layer 10a is filled into the groove portions D (hereinafter, the part of the first resin layer 10a is referred to as "first filled portion 10a1") as illustrated in FIG. 2A. Thus, when stress is applied to the circuit substrate 3, the first filled portions 10a1 having a low Young's modulus reduce the stress to be applied to the first inorganic insulating layer 11a in the groove portions D, and thus crack in the first inorganic insulating layer 11a can be less likely to be generated. As a result, the circuit substrate 3 having excellent electric reliability can be obtained.

The first resin layer 10a abuts the lower surface of the first inorganic insulating layer 11a and the first filled portions 10a1 are disposed in the groove portions D. Thus, due to the anchor effect, the adhesion strength of the first resin layer 10a and the first inorganic insulating layer 11a can be increased and the separation between the first resin layer 10a and the first inorganic insulating layer 11a can be suppressed.

Figure 2B:
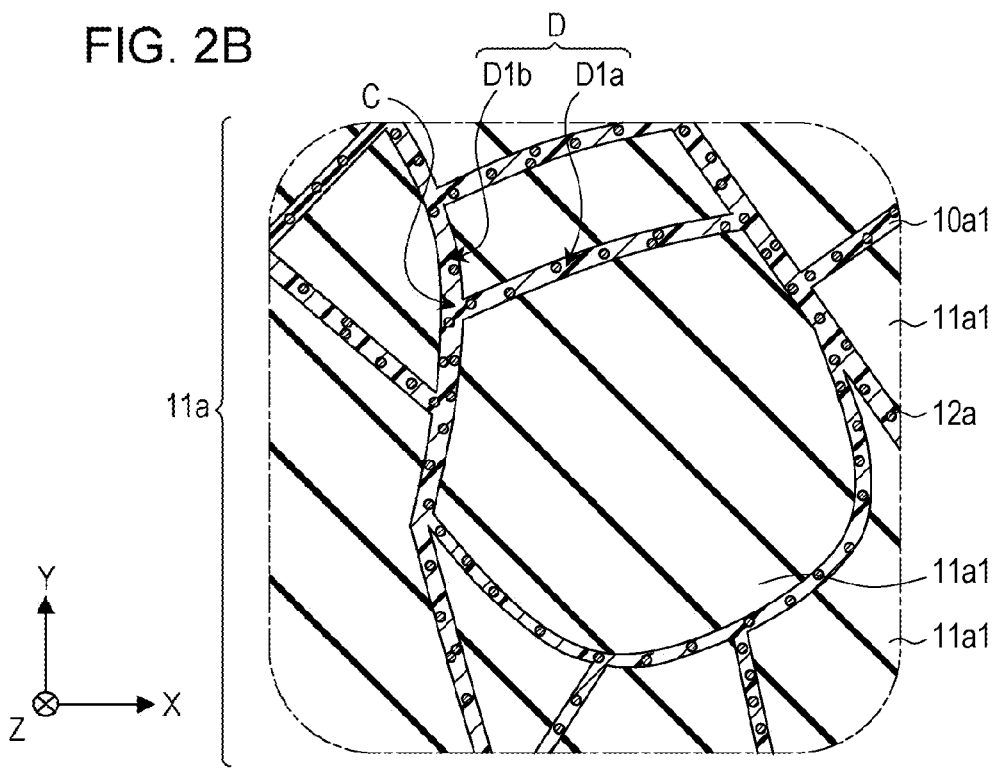
FIG. 2B is a cross sectional view along the plane direction along the IIB-IIB line of FIG. 2A.

As illustrated in FIG. 2B, in this embodiment, the groove portions D are formed in a mesh shape in a plan view and contain two or more small grooves D1. The two or more small grooves D1 are disposed along at least two different directions in a plan view. Thus, when stress is applied to the circuit substrate 3, the applied stress is dispersed in different directions, and thus stress concentration can be suppressed.

As illustrated in FIG. 2B, the ends of the two or more small grooves D1 are preferably connected to the other small grooves D1 in such a manner as not to form an open end. For example, in FIG. 2B, the end of a first small groove D1a is connected to the end of a second small groove D1b at an intersection C, so that both the ends do not form an open end. This is because, with such a structure, the stress to be applied to the end of the small grooves D1 is easily dispersed and the generation of a crack can be suppressed compared with the case where the ends of the small grooves D1 form open ends, i.e., the ends of the small grooves D1 are not connected to the ends of the other small grooves D1.

The groove portions D of this embodiment have two or more small grooves D1 along different directions. Thus, linear regions of the groove portions D can be made small compared with the case where the groove portions D are formed with a single linear groove. Thus, the stress to be applied between the inner wall of the groove portions D and the first filled portions 10a1 along the longitudinal direction of the linear regions can be reduced and the separation of the inner wall of the groove portions D and the first filled portions 10a1 can be suppressed. Each small groove D1 may have any shape in a plan view, for example.

The groove portions D preferably have a loop portion formed in a loop shape in a plan view (e.g., closed shape, such as a circular shape or a polygonal shape) and the first inorganic insulating layer 11a preferably has first inorganic insulating portions 11a1 enclosed by the loop portions of the groove portions D. As a result, each first inorganic insulating portion 11a1 is enclosed by the first filled portion 10a1 having a low Young's modulus. Thus, the stress to be applied to each first inorganic insulating portion 11a1 can be reduced, and a crack in the first inorganic insulating layer 11a can be less likely to be generated.

As described above, since the first resin layer 10a have the first resin portions 10a1 filled into the groove portions D, the first resin layer 10a favorably closely contacts the inner wall of the groove portions D. As a result, the separation of the first filled portions 10a1 from the inner wall of the groove portions D is suppressed. If the groove portions D are located directly under the conductive layers 13, it is preferable that the first filled portions 10a1 closely contact the conductive layers 13 at the upper end of the groove portions D. In this case, the insulation properties of the conductive layers 13 that are separated in the thickness direction increase and a short circuit of the conductive layers 13 can be suppressed compared with the case where the first filled portions 10a1 do not reach the upper end of the groove portions D and cavities are formed between the first filled portions 10a1 and the conductive layers 13. The adhesion strength of the first inorganic insulating layer 11a and the conductive layers 13 can be increased. If the groove portions D are not located directly under the conductive layers 13, i.e., if the groove portions D are located at regions other than the regions directly under the conductive layers 13 on the first inorganic insulating layer 11a, it is preferable that the first filled portions 10a1 closely contact the second resin layer 10b formed on the first inorganic insulating layer 11a at the upper end of the groove portions D. The adhesion strength of the first inorganic insulating layer 11a and the second resin layer 10b located on the upper surface thereof (main surface on which the conductive layers 13 are formed) can be increased.

The ratio of the volume of the first filled portions 10a1 in the first inorganic insulating layer 11a, i.e., the ratio of the volume of the first filled portion 10a1 relative to the total volume of the first inorganic insulating portions 11a1 and the first filled portions 10a1 is preferably set to 1% or more and 15% or lower. The ratio of the volume of the first inorganic insulating portions 11a1 in the first inorganic insulating layer 11a is preferably set to 85% or more and 99% or lower. In this case, the rigidity of the first inorganic insulating layer 11a can be increased and also the coefficient of thermal expansion and the dielectric dissipation factor can be reduced. The ratio of the volume of the first filled portions 10a1 in the first inorganic insulating layer 11a is measured by polishing the main surface of the first inorganic insulating layer 11a, taking an electron micrograph as schematically illustrated in FIG. 2B, determining the area of the first inorganic insulating portions 11a1 and the first filled portions 10a1 with an image processing device, and determining the ratio while defining the area as the volume.

The first filled portions 10a1 preferably contain the first inorganic insulating filler 12a in the groove portions D. As a result, the coefficient of thermal expansion of the first filled portion 10a1 can be brought close to that of the first inorganic insulating layer 11a. Thus, when heat is applied to the circuit substrate 3, the stress to be applied to the first inorganic insulating layer 11a can be reduced. Moreover, the coefficient of thermal expansion of the first filled portion 10a1 can be brought close to that of the first inorganic insulating layer 11a. Thus, when heat is applied to the circuit substrate 3, the separation of a second filled portion 10b1 and the first inorganic insulating layer 11a can be suppressed. Even if a crack is generated in the first filled portions 10a1 due to stress applied to the first filled portions 10a1, the growth of the crack in the first filled portions 10a1 can be suppressed by the first inorganic insulating filler 12a which is made of material harder than resin materials. Two or more of filler particles of the first inorganic insulating filler 12a are preferably contained in the groove portions D along the width direction of the groove portions D.

The first inorganic insulating filler 12a preferably contains the same inorganic insulating materials as that of the first inorganic insulating layer 11a. As a result, the coefficient of thermal expansion of the first filled portions 10a1 can be brought closes to that of the first inorganic insulating layer 11a.

In the groove portions D, the width orthogonal to the longitudinal direction is set to, for example, 0.3 μm or more and 5 μm or lower. By setting the width of the groove portions D to 0.3 μm or more, the first inorganic insulating filler 12a can be easily disposed in the groove portions D. By setting the width of the groove portions D to 5 μm or lower, the ratio of the first inorganic insulating portions 11a1 to the total of the first inorganic insulating portions 11a1 and the first filled portions 10a1 can be increased, the rigidity and the insulation properties of the first inorganic insulating layer 11a can be increased, and the coefficient of thermal expansion and the dielectric dissipation factor can be reduced.

The width of the groove portions D is preferably smaller toward the upper surface side of the first inorganic insulating layer 11a (main surface adjacent to the conductive layers 13) from the lower surface side of the first inorganic insulating layer 11a (main surface adjacent to the first resin layer 10a). As a result, the amount of the first filled portions 10a1 can be reduced toward the upper surface side of the first inorganic insulating layer 11a from the lower surface side of the first inorganic insulating layer 11a and the coefficient of thermal expansion can be reduced. Thus, the differences in the coefficient of thermal expansion of the first resin layer 10a, the first inorganic insulating layer 11a, and each of the conductive layers 13 can be reduced. If the groove portions D are formed directly under the conductive layers 13, the insulation properties at the upper surface side of the first inorganic insulating layer 11a are increased and also the signal transmission characteristics of the conductive layers 13 can be increased by increasing the contact area of the conductive layers 13 and the first inorganic insulating layer 11a. The width of the upper end of the groove portions D is preferably set to 0.5 times or more and 0.97 times or lower than the lower end of the groove portions D.

In the circuit substrate 3 of this embodiment, the second inorganic insulating layer 11b has the groove portions D penetrating in the thickness direction and a part of the second resin layer 10b is filled into the groove portions D (hereinafter, the part of the second resin layer 10b is referred to as "second filled portion 10b1") similarly as in the first inorganic insulating layer 11a described above as illustrated in FIG. 3. Thus, when stress is applied to the circuit substrate 3, second filled portions 10b1 having a low Young's modulus reduce the stress to be applied to the second inorganic insulating layer 11b in the groove portions D. Thus, the crack in the second inorganic insulating layer 11b can be less likely to be generated. As a result, the circuit substrate 3 having excellent electric reliability can be obtained.

The second inorganic insulating layer 11b, the second resin layers 10b, the second filled portions 10b1, and the second inorganic insulating filler 12b preferably have the same structure as those of the first inorganic insulating layer 11a, the first resin layer 10a, the first filled portions 10a1, and the first inorganic insulating filler 12a described above, respectively.

Figure 3:
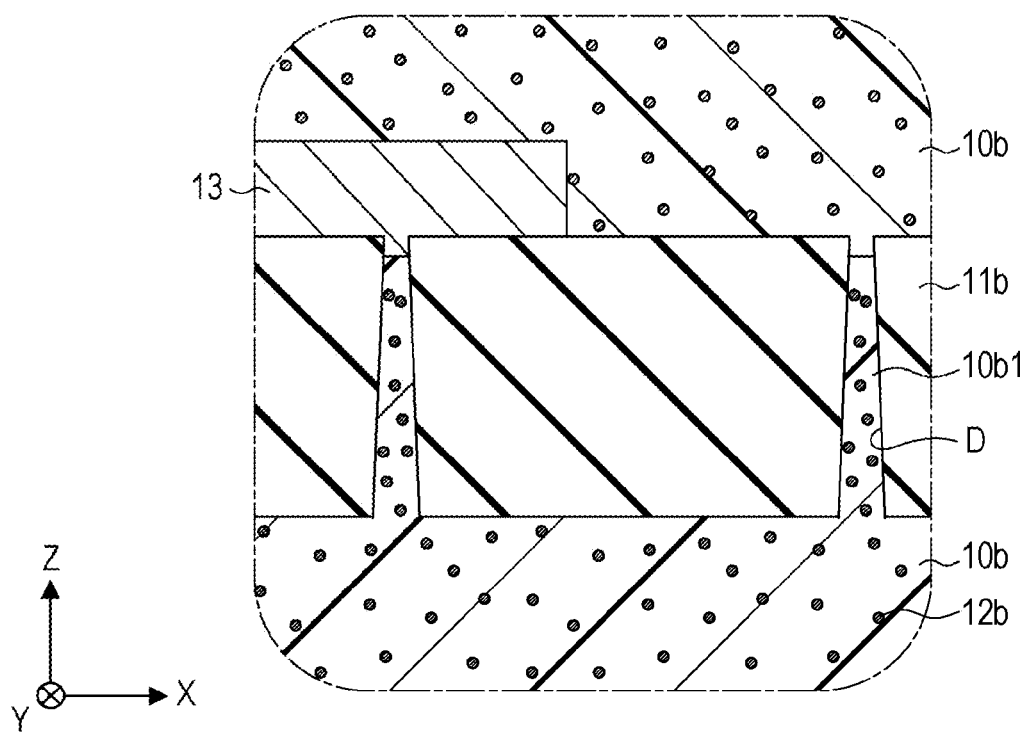
FIG. 3 is an enlarged cross sectional view illustrating an III portion of the mounting structure illustrated in FIG. 1A.

As illustrated in FIG. 3, the groove portions D are preferably filled with a part of the conductive layers 13 on the upper surface of the second inorganic insulating layer 11b. As a result, the adhesion strength between the second inorganic insulating layer 11b and the conductive layers 13 can be increased due to the anchor effect. Even if area of the conductive layer 13 is small, the conductive layers 13 can be firmly attached to the second inorganic insulating layer 11b. The part of the conductive layers 13 is preferably adhered to the second filled portions 10b1 in the groove portions D.

Thus, the above-described mounting structure 1 demonstrates desired functions by driving or controlling electronic components based on power supply or signals to be supplied through the circuit substrate 3.

Next, a method for manufacturing the above-described mounting structure 1 is described with reference to FIGS. 4 to 9.

(Production of Core Substrate)

Figure 4A:
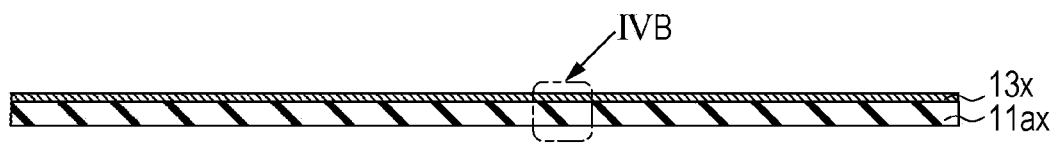
FIG. 4A is a cross sectional view along the vertical direction illustrating a process for manufacturing the mounting structure illustrated in FIG. 1A
Figure 4B:
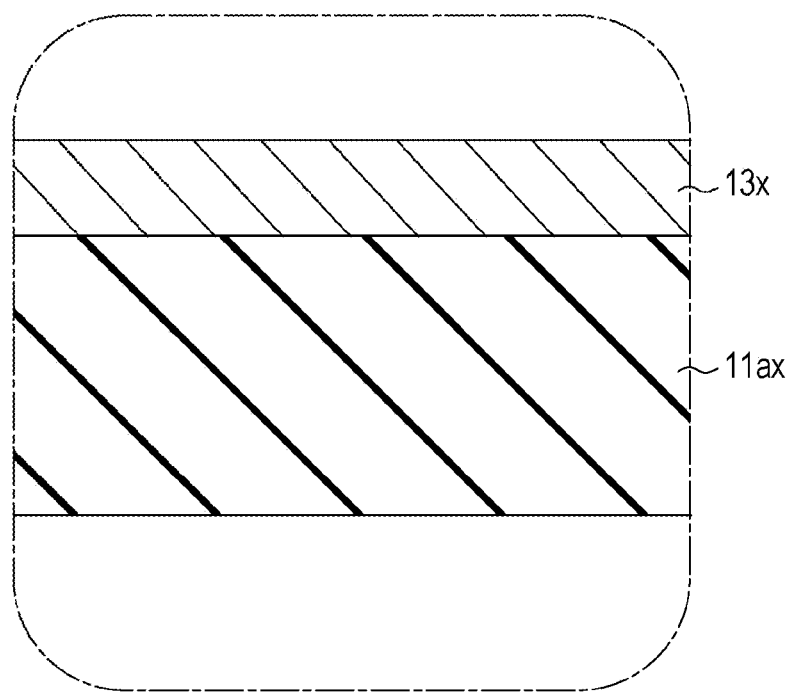
FIG. 4B is an enlarged cross sectional view illustrating an IVB portion of FIG. 4.

(1) As illustrated in FIGS. 4A and 4B, a first inorganic insulating sol 11ax containing a solid content containing two or more inorganic insulating particles 11p and a first solvent and a copper foil 13x which is to be a support member of the first inorganic insulating sol 11ax are prepared, and then the first inorganic insulating sol 11ax is applied to one main surface of the copper foil 13x.

The first inorganic insulating sol 11ax preferably contains the inorganic insulating particles 11p in a proportion of 1% or more and 50% or lower and the first solvent in a proportion of 50% or more and 99% or lower. By blending the inorganic insulating particles 11p in a proportion of 1% or more, the internal structure of the first inorganic insulating layer 11a can be made dense and the thickness thereof can be made large. By blending the first solvent in a proportion of 50% or more, the viscosity of the first inorganic insulating sol 11ax can be lowered, the flatness of the upper surface of the first inorganic insulating layer 11a can be increased, and the flatness of the upper surface of the circuit substrate 3 can be increased.

Here, the diameter of the inorganic insulating particles 11p is preferably set to 3 nm or more. In this case, the viscosity of the first inorganic insulating sol 11ax can be lowered.

As the first solvent, solvents containing organic solvents, such as methanol, isopropanol, methyl ethyl ketone, methyl isobutyl ketone, propylene glycol monomethyl ether, or dimethyl acetamide, can be used, for example. Among the above, it is preferable to use a solvent containing methanol or propylene glycol monomethyl ether. As a result, the first inorganic insulating sol 11ax can be uniformly applied, and the first solvent can be efficiently evaporated in a process (2).

The first inorganic insulating sol 11ax can be applied using a dispenser or screen printing, for example.

The first inorganic insulating sol 11ax applied to one main surface of the copper foil 13x is formed in a plate shape and the thickness after drying is set to 3 μm or more and 110 μm or lower, for example.

Figure 5A:
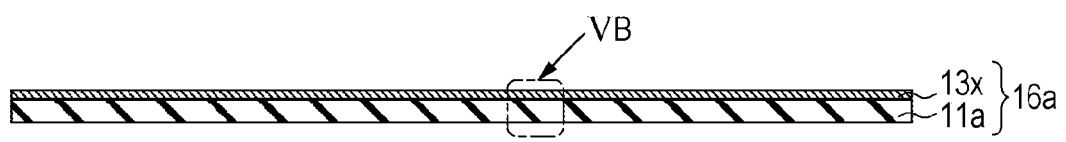
FIG. 5A is a cross sectional view along the vertical direction illustrating a process for manufacturing the mounting structure illustrated in FIG. 1A

(2) By evaporating the first solvent, and then heating the solid content remaining due to the evaporation to connect the inorganic insulating particles 11p, the first inorganic insulating sol 11ax is formed into the first inorganic insulating layer 11a, whereby a first laminated sheet 16a having the copper foil 13x and the first inorganic insulating layer 11a is formed as illustrated in FIG. 5A.

Figure 5B:
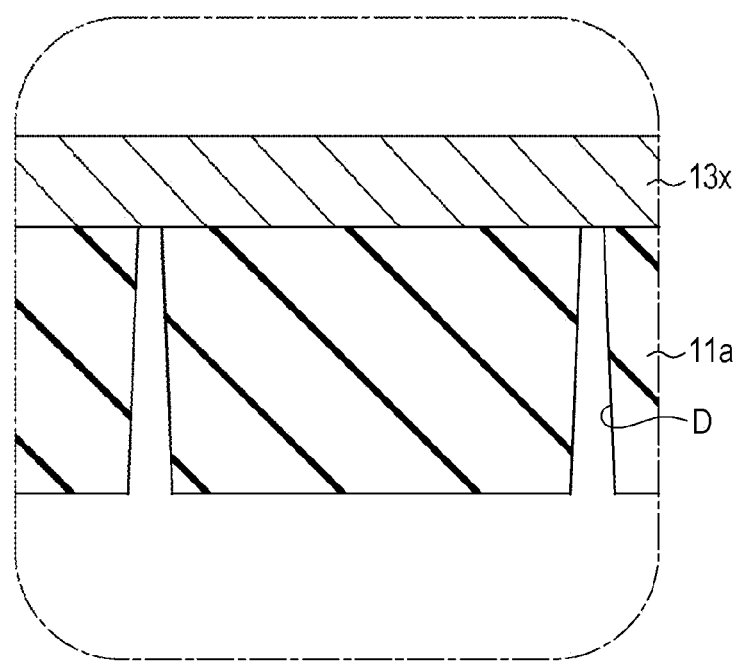
FIG. 5B is an enlarged cross sectional view illustrating an VB portion of FIG. 5A.

Here, since the first inorganic insulating sol 11ax is formed on one main surface of the copper foil 13x in a plate shape, the solid content of the first inorganic insulating sol 11ax contract along the plane direction when the first solvent evaporates. Thus, the groove portions D penetrating the first inorganic insulating layer 11a in the thickness direction can be formed as illustrated in FIG. 5B.

The copper foil 13x is preferably provided with a convex portion on one main surface to which the first inorganic insulating sol 11ax is applied by, for example, etching or plasma treatment in the process (1). As a result, by reducing the volume of the first inorganic insulating sol 11ax on the convex portion of the copper foil 13x, the contraction is suppressed on the convex portion of the copper foil 13x when the solid content of the first inorganic insulating sol 11ax contracts in the plane direction, and then the groove portion D can be formed in a region where the convex portion is not formed. Thus, by adjusting the size, the density, and the formation region of the convex portion on one main surface of the copper foil 13x, the size, the density, and the formation region of the groove portions D can be adjusted.

A part of the groove portions D is formed along the convex portion. Thus, by adjusting the shape of the convex portion, the shape of the groove portions D can be easily adjusted. For example, by forming the convex portion in a circular shape in a plan view, the groove portions D are formed into a circular loop shape in a plan view and the formation of two or more of the first inorganic insulating portions 11a1 enclosed by the groove portions D can be facilitated.

The inorganic insulating particles 11p are preferably precipitated to the copper foil 13x side by the gravity when evaporating the first solvent. As a result, the density of the inorganic insulating particles 11p at the copper foil 13x side of the solid content in the first inorganic insulating sol 11ax can be increased and the contraction amount at the side of the copper foil 13x having a high density can be reduced due to the solid content of the first inorganic insulating sol 11ax when heating the first inorganic insulating sol 11ax. Thus, the width of the groove portions D can be made smaller toward the upper surface side (one main surface on which the copper foil 13x is formed) from the lower surface side (the other main surface on which the copper foil 13x is not formed) of the first inorganic insulating layer 11a. The precipitation of the inorganic insulating particles 11p by the gravity can be achieved by setting the evaporation temperature to be low and by prolonging the evaporation time, for example.

In the heating of the first inorganic insulating sol flax, the temperature is preferably set to be equal to or higher than the boiling point of the first solvent and lower than the crystallization initiation temperature of the inorganic insulating particles 11p. Specifically, in the heating of the first inorganic insulating sol 11ax, the temperature is set to, for example, 100° C. or more and lower than 600° C. and the time is set to, for example, 0.5 hour or more and 24 hours or lower. As a result, due to the fact that the heating temperature is equal to or higher than the boiling point of the first solvent, the remaining first solvent can be efficiently evaporated. Moreover, due to the fact that the heating temperature is lower than the crystallization initiation temperature of the inorganic insulating particles 11p, the crystallization of the inorganic insulating particles 11p is suppressed, and thus the amorphous state degree thereof can be increased. As a result, the inorganic insulating particles 11p can reduce the anisotropy of the coefficient of thermal expansion resulting from the crystal structure anisotropy, thereby suppressing the generation of a crack. In particular, if silicon oxide is used as inorganic insulating materials of the inorganic insulating particles 11p, the crystallization of the inorganic insulating particles 11p can be effectively suppressed. A crystal phase region in the inorganic insulating materials is set to preferably lower than 25% and particularly preferably lower than 10% of the volume of the first inorganic insulating layer 11a. The crystallization initiation temperature is a temperature at which amorphous inorganic insulating materials initiate crystallization.

The diameter of the inorganic insulating particles 11p is preferably set to 110 nm or lower. As a result, even when the heating temperature of the first inorganic insulating sol 11ax is lower than the crystallization initiation temperature of the inorganic insulating particles 11p, the inorganic insulating particles 11p can be firmly connected to each other. This is speculated as follows: Since the diameter of the inorganic insulating particles 11p is set to be as ultra small as 110 nm or lower, the atoms of the inorganic insulating particles 11p, particularly the surface atoms, actively move. Thus, the inorganic insulating particles 11p are firmly connected to each other at such a low temperature.

If the diameter of the inorganic insulating particles 11p is smaller, the inorganic insulating particles 11p can be firmly connected to each other at a lower temperature. The temperature at which the inorganic insulating particles 11p can be firmly connected to each other is about 250° C. if the diameter of the inorganic insulating particles 11p is set to 110 nm or lower, for example, and is about 150° C. if the diameter of the inorganic insulating particles 11p is set to 50 nm or lower.

The first inorganic insulating sol can be heated in, for example, the air atmosphere. When the temperature is increased to 150° C. or higher, the oxidization of the copper foil 13x is suppressed. Thus, the first inorganic insulating sol is preferably heated in vacuum, an inactive atmosphere, such as argon, or a nitrogen atmosphere.

Figure 6A:
FIGS. 6A, 6B, and 6D are cross sectional views along the vertical direction illustrating processes for manufacturing the mounting structure illustrated in FIG. 1A

(3) As illustrated in FIG. 6A, a first resin precursor sheet 10ax serving as the first resin layer is prepared. The first resin precursor sheet 10ax can be produced by, for example, laminating two or more sheets containing an uncured resin and a base material. The "uncured" refers to A-Stage or B-Stage specified in ISO472:1999.

Figure 6B:
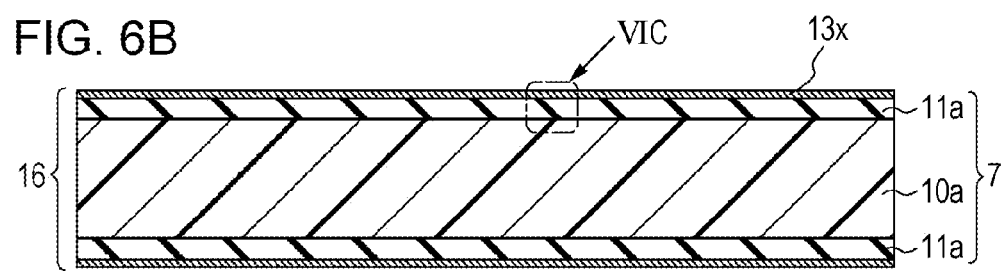

(4) As illustrated in FIG. 6B, a first laminated sheet 16 is laminated on each of the upper and lower surfaces of the first resin precursor sheet 10ax through the first inorganic insulating layer 11a. Then, the laminate is heated and pressurized in the vertical direction to cure the first resin precursor sheet 10ax to form the first resin layer 10a. Thus, the base 7 having the first resin layer 10a and the first inorganic insulating layers 11a and provided with the copper foil 13x on each of the upper and lower surfaces is formed. The structure having the base 7 and the copper foils 13x disposed on the upper and lower surfaces of the base 7 is a laminated board 15.

Figure 6C:
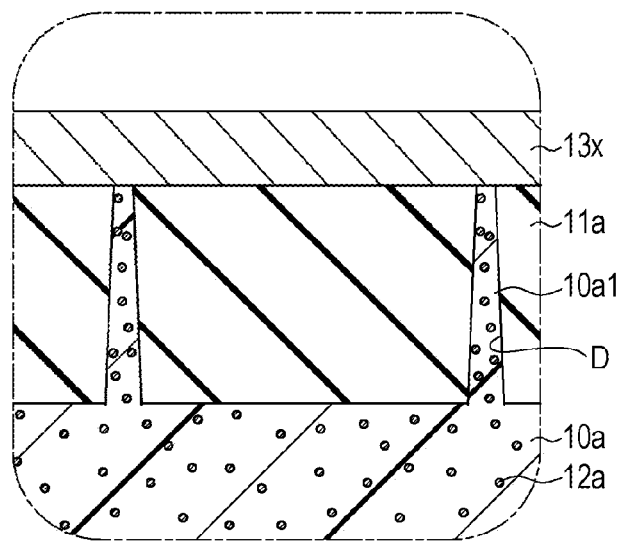
FIG. 6C is an enlarged cross sectional view illustrating an VIC portion of FIG. 6B.

Due to the fact that the first resin precursor sheet 10ax is softened at heating and pressurizing the laminate, a part of the first resin precursor sheet 10ax can flow into and fill the groove portions D of the first inorganic insulating layer 11a. Thus, as illustrated in FIG. 6C, the first filled portions 10a1 can be formed in the groove portions D of the first inorganic insulating layer 11a. When a part of the first resin precursor sheet 10ax is filled into the groove portions D, the first inorganic insulating filler 12a can be arranged in the groove portions D.

The width of the groove portions D is made smaller toward the upper surface side of the first inorganic insulating layer 11a from the lower surface side of the first inorganic insulating layer 11a. Thus, a part of the first resin precursor sheet 10ax can be efficiently filled into the groove portions D of the first inorganic insulating layer 11a. The first inorganic insulating filler 12a can be efficiently arranged in the groove portions D.

In the heating and pressurization of the laminate, the temperature is preferably set to be equal to or higher than the curing initiation temperature and lower than the thermal decomposition temperature of the first resin layer 10a. Specifically, in the heating and pressurization of the laminate, the temperature is set to, for example, 170° C. or higher and 230° C. or lower, the pressure is set to, for example, 2 MPa or more and 3 MPa or lower, and the time is set to, for example, 0.5 hour or more and 2 hours or lower. The curing initiation temperature refers to a temperature at which resin enters a C-Stage state specified in ISO472:1999. The thermal decomposition temperature refers to a temperature at which the mass of the resin decreases by 5% in thermogravimetric analysis specified in ISO11358:1997.

The laminated board 15 can be formed as described above. The laminated board 15 has a pair of the first inorganic insulating layers 11a and the first resin layer 10a disposed between the first inorganic insulating layers 11a, in which the first inorganic insulating layers 11a have the groove portions D penetrating in the thickness direction and a part of the first resin layer 10a is disposed in the groove portions D.

Figure 6D:
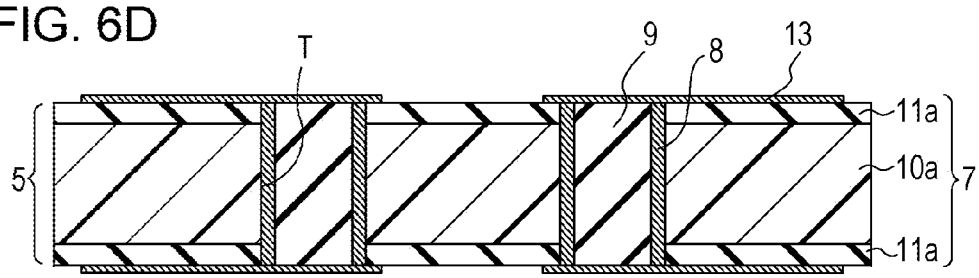

(5) As illustrated in FIG. 6D, the through-hole conductors 8 penetrating the base 7 in the vertical direction and the conductive layers 13 are formed on the base 7. Specifically, the formation is carried out as follows.

First, two or more through-holes T penetrating the base 7 in the thickness direction are formed by, for example, drill processing or laser processing. Next, conductive materials are adhered to the inner wall of the through-holes T by, for example, electroless plating, a vapor deposition method, a CVD method, or a sputtering method to form the cylindrical through-hole conductors 8. Next, resin materials or the like are filled into the cylindrical through-hole conductors 8 to form insulators 9. Next, conductive materials are adhered to an exposed portion of the insulators 9 by, for example, an electroless plating method, a vapor deposition method, a CVD method, or a sputtering method. Next, the copper foil 13x is patterned using a photolithographic technique, etching, or the like to thereby form the conductive layers 13.

As described above, the core substrate 5 can be produced.

(Production of Circuit Substrate)

Figure 7A:
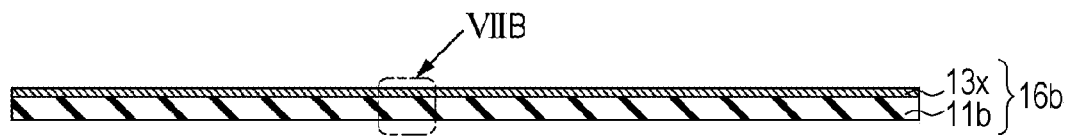
FIGS. 7A and 7C are cross sectional views along the vertical direction illustrating processes for manufacturing the mounting structure illustrated in FIG. 1A
Figure 7B:
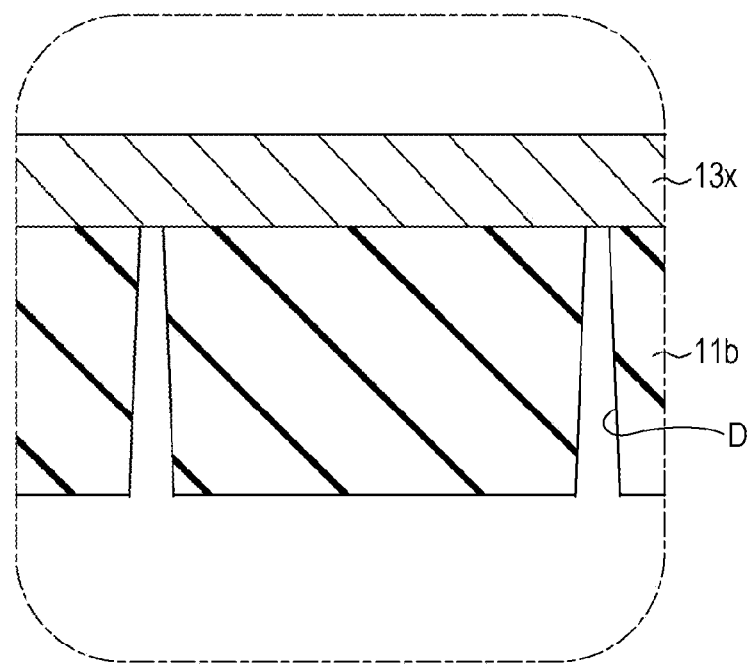
FIG. 7B is an enlarged cross sectional view illustrating an VIIB portion illustrated in FIG. 7B.
Figure 7C:
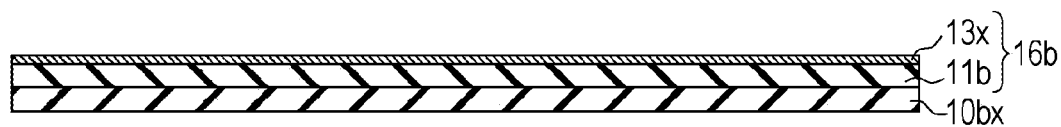

(6) As illustrated in FIGS. 7A and 7B, a second laminated sheet 16b having the copper foil 13x and the second inorganic insulating layer 11b are formed in the same manner as in the processes (1) and (2). Then, as illustrated in FIG. 7C, an uncured second resin precursor sheet 10bx is placed on the second laminated sheet 16b through the second inorganic insulating layer 11b.

Figure 8A:
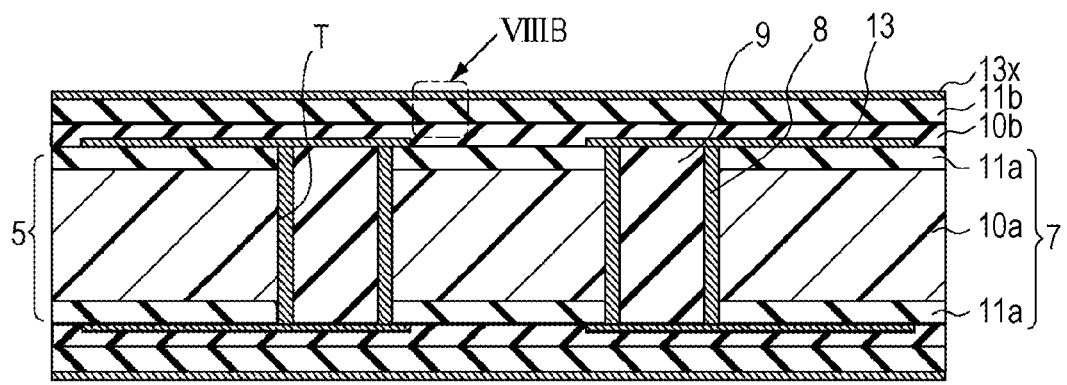
FIG. 8A is a cross sectional view along the vertical direction illustrating a process for manufacturing the mounting structure illustrated in FIG. 1A

(7) As illustrated in FIG. 8A, the second laminated sheets 16b are laminated on each of the upper and lower surfaces of the core substrate 5 through the second resin precursor sheets 10bx, and then the laminate is heated and pressurized in the vertical direction to cure the second resin precursor sheet 10bx to form the second resin layer 10b.

Figure 8B:
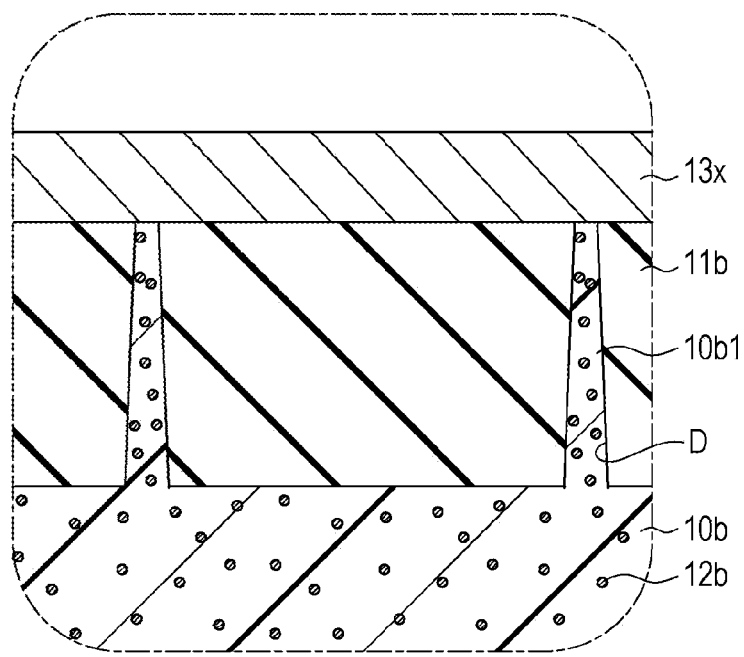
FIG. 8B is an enlarged cross sectional view illustrating an VIIIB portion illustrated in FIG. 8B.

Due to the fact that the second resin precursor sheet 10bx is softened at heating and pressurizing the laminate similarly as in the process (4), a part of the second resin precursor sheet 10bx can flow into and fill the groove portions D of the second inorganic insulating layer 11b. Thus, as illustrated in FIG. 8B, the second filled portions 10bx can be formed in the groove portions D of the second inorganic insulating layer 11b. When a part of the second resin precursor sheet 10bx is filled into the groove portions D, the second inorganic insulating filler 12b can be arranged in the groove portions D.

The laminate can be heated and pressurized in the same manner as in, for example, the process (4).

Figure 9A:
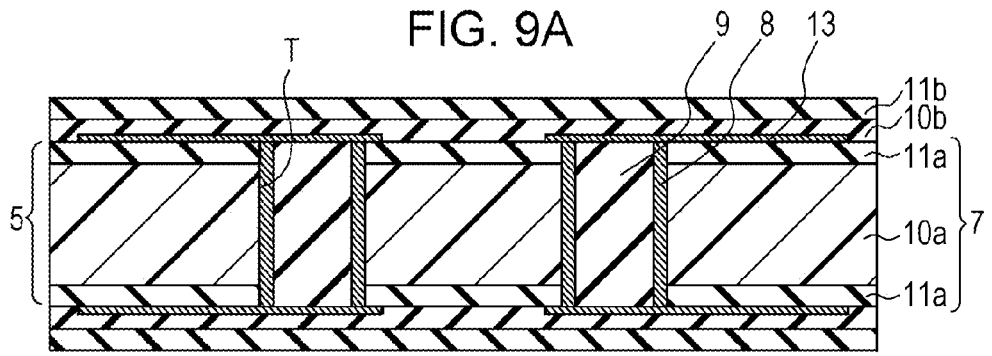
FIGS. 9A to 9C are cross sectional views along the vertical direction illustrating processes for manufacturing the mounting structure illustrated in FIG. 1A.

(8) As illustrated in FIG. 9A, the copper foils 13x are separated from the second inorganic insulating layers 11b by an etching method using a mixed liquid of sulfuric acid and hydrogen peroxide water, a ferric chloride solution, or a cupric chloride solution.

Figure 9B:
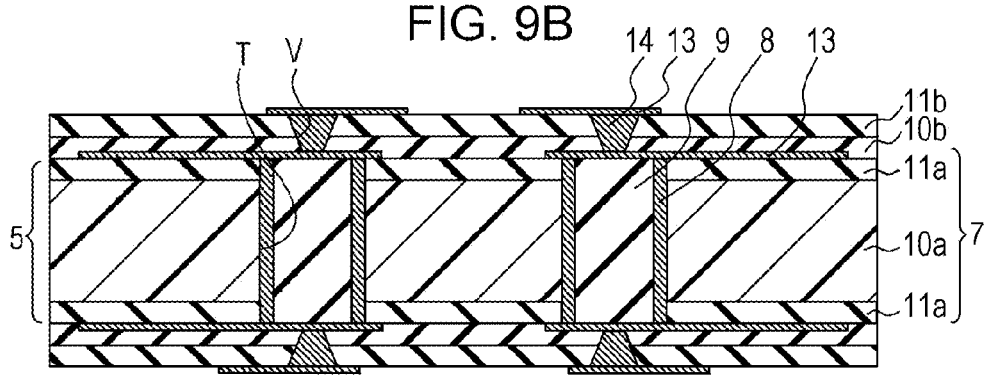

(9) As illustrated in FIG. 9B, via-conductors 14 penetrating the second resin layer 10b and the second inorganic insulating layer 11b in the vertical direction are formed, and then the conductive layers 13 are formed on the second inorganic insulating layer 11b. Specifically, the formation is carried out as follows.

First, for example, via-holes V are formed in the second resin layer 10b and the second inorganic insulating layer 11b using a YAG laser device or a carbon dioxide laser device, and then at least one part of the conductive layers 13 is exposed in the via-holes V. Next, via-conductors 14 are formed in the via-holes V and also the conductive layers 13 are formed on the second inorganic insulating layer 11b by, for example, a semi-additive method, a subtractive method, or a full-additive method.

Here, it is preferable that desmear treatment be performed after forming the via-holes V, and then the upper end of the second filled portion 10b1 be etched by the desmear treatment. As a result, a concave portion can be formed in the upper end of the groove portions D. Then, by forming the conductive layers 13 on the second inorganic insulating layer 11b having the concave portion, a part of the conductive layers 13 can be disposed in the groove portions D.

Figure 9C:
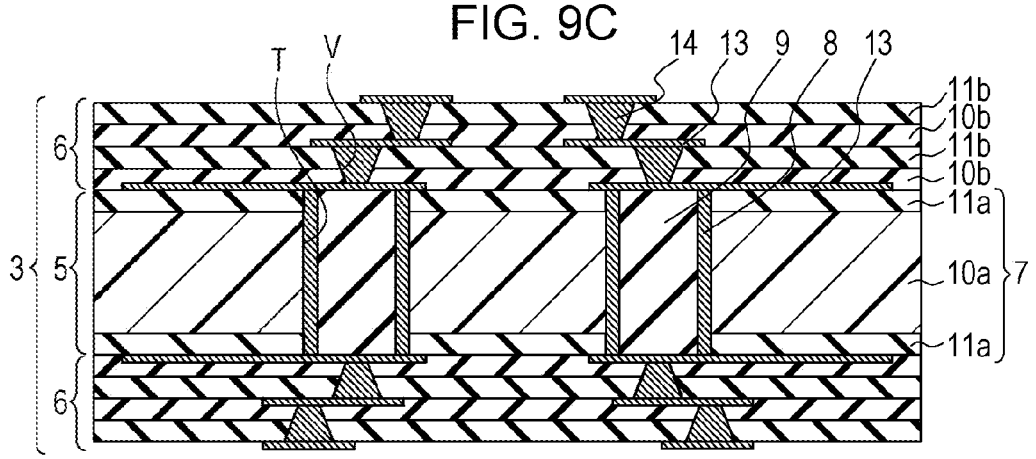

(10) As illustrated in FIG. 9C, by repeating the processes (6) to (9), the circuit layer 6 is formed on the upper and lower surfaces of the core substrate 5. By repeating this process, the number of the layers of the circuit layers 6 can be further increased.

As described above, the circuit substrate 3 can be produced.

(Production of Mounting Structure)

(11) The electronic component 2 is flip-chip mounted on the circuit substrate 3 through bumps 4, whereby the mounting structure 1 illustrated in FIG. 1 can be produced.

The present invention is not limited to the above-described embodiments and can be variously modified, improved, combined, or the like insofar as it does not deviate from the scope of the present invention.

For example, in the embodiments described above, the present invention is described with reference to a buildup multilayer board containing a core substrate and a circuit layer as an example but the present invention can be applied to circuit substrates other than the buildup multilayer board. For example, the present invention can also be applied to interposer boards, coreless boards, or a single layer board containing only a core substrate.

In the above-described embodiments of the present invention, the first resin layer contains base materials, but the first resin layer may contain no base materials and may contain metal plates.

In the above-described embodiments of the present invention, the first resin layer and the second resin layer are formed with thermosetting resin, but at least one or all of the first resin layer and the second resin layer may be formed with thermoplastic resin. As the thermoplastic resin, fluororesin, aromatic liquid crystalline polyester resin, polyether ketone resin, polyphenylene ether resin, polyimide resin, or the like can be used, for example.

In the above-described embodiments of the present invention, both the core substrate and the circuit layers of the circuit substrate have the inorganic insulating layer, but at least either the core substrate or the circuit layers may have the inorganic insulating layer. Here, the inorganic insulating layer may be either the first inorganic layer or the second inorganic layer described above.

In the above-described embodiments of the present invention, the base has the first resin layer and the inorganic insulating layers disposed on the upper and lower surfaces of the first resin layer, but bases having other structures may be used as the base and, for example, a resin base or a ceramic base may be used.

Figure 10A:
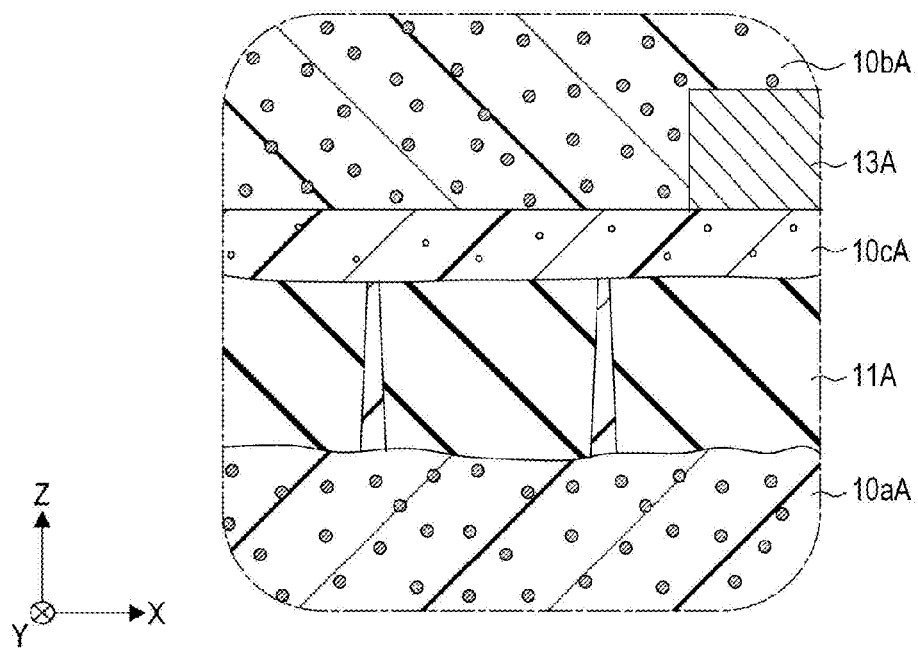
FIG. 10A is an enlarged cross sectional view illustrating a portion corresponding to the IIA portion of FIG. 1A in a cross sectional view along the vertical direction of a mounting structure according to another embodiment of the present invention and FIG. 10B is a photograph of a part of the cross section of a laminated board of Examples along the vertical direction taken by a field emission type electron microscope.

The above-described embodiments of the present invention are described with reference to a structure such that the inorganic insulating layer abuts the conductive layer as an example, but a third resin layer 10cA may be interposed between the inorganic insulating layer 11A and the conductive layer 13A as illustrated in FIG. 10A. The thickness of the third resin layer 10cA is preferably set to be smaller than that of the first resin layer 10aA and the second resin layer 10bA.

In the above-described embodiments of the present invention, two or more of the small grooves D1 are connected to each other, but the small grooves D1 may be separated from each other.

In the above-described embodiments of the present invention, the first solvent is evaporated, and then the first inorganic insulating sol is heated in the process (2), but the evaporation of the first solvent and the heating of the first inorganic insulating sol may be simultaneously performed.

In the above-described embodiments of the present invention, the uncured second resin precursor sheet is placed on the second inorganic insulating layer in the process (6), but an uncured and liquid second resin precursor sheet may be applied to the second inorganic insulating layer 11, so that the second resin precursor sheet is filled into the groove portions.

In the above-described embodiments of the present invention, the second filled portion is formed by heating and pressurizing the laminate containing the core substrate, the second resin precursor sheet, and the second laminated sheet, and then filling the groove portions with a part of the second resin layer in the process (7), but the second filled portion may be formed in the groove portions by heating and pressurizing the second resin precursor sheet and the second laminated sheet before forming the laminate after the process (6).

In the above-described embodiments of the present invention, the copper foil is separated from the second inorganic insulating layer in the process (8), and then the conductive layer is formed on the second inorganic insulating layer in the process (9), but the conductive layer may be formed by patterning the copper foil without separating the copper foil from the second inorganic insulating layer.

In the above-described embodiments of the present invention, the laminated board having a copper foil is used, but the laminated board may have a metallic foil containing materials other than copper, may have a conductive material layer other than a metallic foil, or may have only a base without having a conductive material layer.

In the above-described embodiments of the present invention, the laminated sheet having a copper foil is used as a support member, but the laminated sheet may have a support member other than a copper foil. For example, a metallic foil other than a copper foil may be used or a conductive material layer other than a metallic foil may be used as the support member. As the support member, an insulating material layer, such as a resin sheet containing thermoplastic resin, may be used.

EXAMPLES

Hereinafter, the present invention is described in detail with reference to Examples, but is not limited by the following Examples and modification and embodiments that do not deviate from the gist of the invention are all included in the scope of the present invention.

(Evaluation Method)

A laminated board having a copper foil, an inorganic insulating layer containing inorganic insulating particles, and a resin layer containing an inorganic insulating filler was produced. Then, a photograph of the cross section obtained by cutting laminated board in the thickness direction and polishing the same was taken using a field emission type electron microscope (manufactured by JEOL, JSM-7000F) and then observed.

(Production Conditions of Laminated Board)

First, PGM-ST manufactured by Nissan Chemical Industries, Ltd. was prepared as an inorganic insulating sol containing inorganic insulating particles made of silicon oxide (average particle diameter: 10-15 nm).

Next, the inorganic insulating sol was applied onto a copper foil, and then the inorganic insulating sol was heated under the conditions of Temperature: 150° C., Time: 2 hours, and Atmosphere: air and the solvent was evaporated, thereby producing a laminated sheet.

Next, the laminated sheet was laminated on each of the upper and lower surfaces of a resin precursor sheet containing an uncured cyanate resin and an inorganic insulating filler containing silicon oxide, and then the laminate was heated and pressurized under the conditions of Time: 1 hour, Pressure: 3 MPa, and Temperature: 180° C., thereby producing a laminated board.

Examples

Figure 10B:
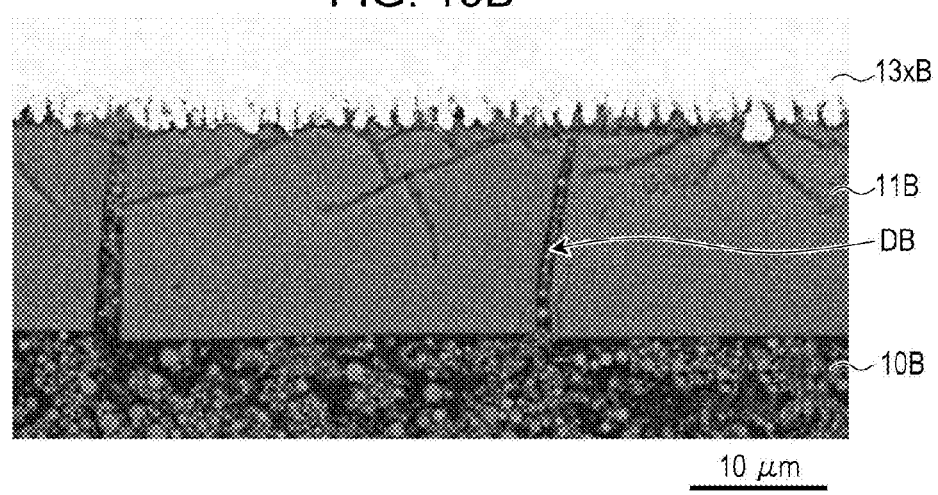
Figure 11A:
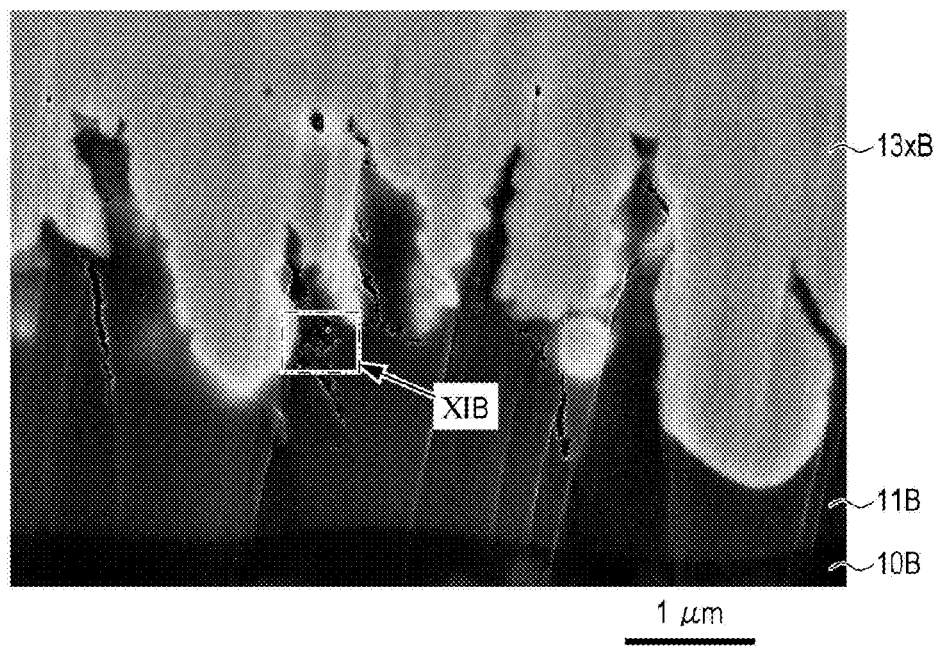
FIG. 11A is a photograph of a part of the cross section of a laminated board of Examples along the vertical direction taken by a field emission type electron microscope and FIG. 11B is a photograph of an enlarged XIB portion of FIG. 11A.
Figure 11B:
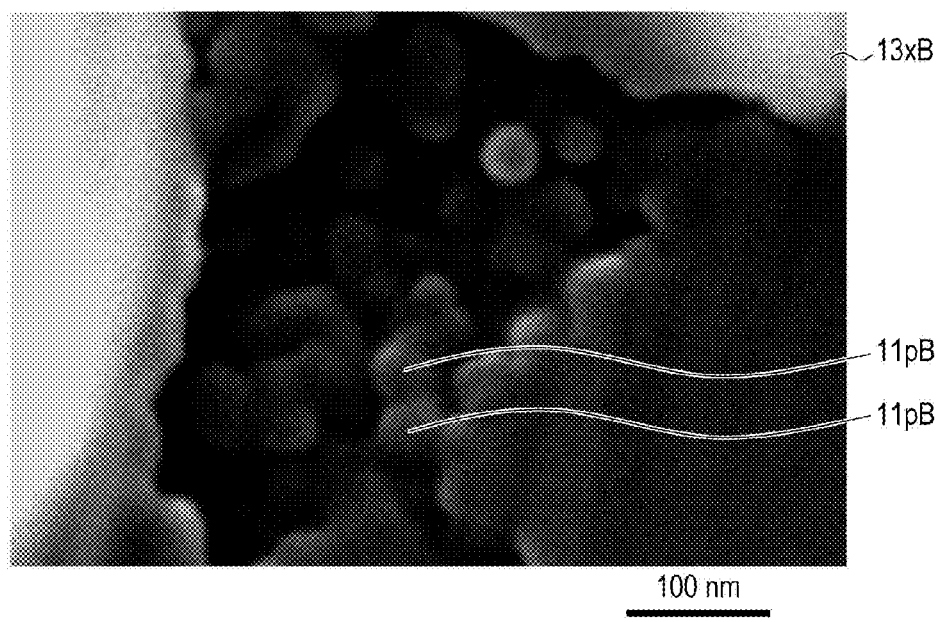

The laminated board produced as described above has a copper foil 13xB, an inorganic insulating layer 11B, and a resin layer 10B as illustrated in FIG. 10B, in which the inorganic insulating layer 11B has groove portions DB penetrating in the thickness direction and the groove portions DB were filled with a part of the resin layer 10B. It was observed that inorganic insulating particles 11pB were connected to each other in the inorganic insulating layer 11B of the laminated board as illustrated in FIGS. 11A and 11B.

What is claimed is:

1. A circuit substrate comprising:
a first resin layer,
a first inorganic insulating layer,
a first groove portion penetrating the first inorganic insulating layer in a thickness direction thereof, and
a second inorganic insulating layer,
wherein the first resin layer is between the first inorganic insulating layer and the second inorganic insulating layer, and a part of the first resin layer is in the first groove portion.

2. The circuit substrate according to claim 1,
wherein the first resin layer contacts with a main surface of the first inorganic insulating layer.

3. The circuit substrate according to claim 1, further comprising:
a second groove portion penetrating the second inorganic insulating layer in a thickness direction thereof,
wherein another part of the first resin layer is in the second groove portion.

4. The circuit substrate according to claim 1, further comprising:
a second groove portion penetrating the second inorganic insulating layer in a thickness direction thereof, and
a second resin layer,
wherein the second inorganic insulating layer is between the first resin layer and the second resin layer, and a part of the second resin layer is in the second groove portion.

5. The circuit substrate according to claim 4,
wherein the part of the second resin layer in the second groove portion contacts with the first resin layer.

6. The circuit substrate according to claim 1, further comprising:
a conductor in a hole penetrating the first inorganic insulating layer in the thickness direction thereof.

7. The circuit substrate according to claim 6,
wherein a width of the first groove portion is smaller than a width of the conductor.

8. The circuit substrate according to claim 6, further comprising:
a first conductive layer, and
a second conductive layer,
wherein the first resin layer and the first inorganic insulating layer are between the first conductive layer and the second conductive layer, and the conductor electrically connects the first conductive layer and the second conductive layer.

9. The circuit substrate according to claim 8,
wherein the first conductive layer is on the first inorganic insulating layer, and the part of the first resin layer in the first groove portion contacts with the first conductive layer.

10. The circuit substrate according to claim 8,
wherein the first conductive layer is on the first inorganic insulating layer, and a part of the first conductive layer is in the first groove portion.

11. The circuit substrate according to claim 8,
wherein the first inorganic insulating layer is between the first conductive layer and the first resin layer, and a width of the first groove portion decreases toward the first conductive layer from the first resin layer.

12. The circuit substrate according to claim 8,
wherein the first resin layer is on a main surface and a side surface of the second conductive layer.

13. A mounting structure, comprising:
the circuit substrate according to claim 1, and
an electronic component mounted on the circuit substrate.

* * * * *